US012660419B2

(12) United States Patent
Ahn et al.

(10) Patent No.: US 12,660,419 B2
(45) Date of Patent: Jun. 16, 2026

(54) LIGHT EMITTING DISPLAY DEVICE HAVING THIN FILM TRANSISTORS COMPONENTS IN DIFFERENT LAYERS

(71) Applicant: LG Display Co., Ltd., Seoul (KR)

(72) Inventors: Kyoungjin Ahn, Gyeonggi-do (KR); Hyunseok Na, Gyeonggi-do (KR); DongSeok Park, Seoul (KR); Hyoungsun Park, Seoul (KR); JaeJun Ahn, Gumi-si (KR); ChangSuk Hyun, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 609 days.

(21) Appl. No.: 18/123,750

(22) Filed: Mar. 20, 2023

(65) Prior Publication Data

US 2023/0301138 A1 Sep. 21, 2023

(30) Foreign Application Priority Data

Mar. 21, 2022 (KR) ........................ 10-2022-0034487

(51) Int. Cl.
| | |
|---|---|
| *H10K 59/12* | (2023.01) |
| *H10D 86/40* | (2025.01) |
| *H10D 86/60* | (2025.01) |
| *H10K 59/121* | (2023.01) |
| *H10K 59/124* | (2023.01) |
| *H10K 59/126* | (2023.01) |
| *H10K 59/40* | (2023.01) |

(52) U.S. Cl.
CPC ....... *H10K 59/1213* (2023.02); *H10D 86/423* (2025.01); *H10D 86/481* (2025.01); *H10D 86/60* (2025.01); *H10K 59/1216* (2023.02); *H10K 59/124* (2023.02); *H10K 59/126* (2023.02); *H10K 59/40* (2023.02)

(58) Field of Classification Search
CPC .. H10K 59/1213; H10K 59/40; H10K 59/124; H10K 59/126; H10K 59/1216; H10D 86/60; H10D 86/481
USPC .......................................................... 257/40
See application file for complete search history.

(56) References Cited

U.S. PATENT DOCUMENTS

| | | | |
|---|---|---|---|
| 2020/0266259 A1* | 8/2020 | Lee ...................... | H10K 59/131 |
| 2021/0399072 A1* | 12/2021 | Song .................... | H10K 59/131 |

(Continued)

FOREIGN PATENT DOCUMENTS

| | | | | |
|---|---|---|---|---|
| CN | 109979366 A | * | 7/2019 | ............. G09G 3/006 |
| KR | 10-2016-0027903 A | | 3/2016 | |

(Continued)

*Primary Examiner* — Phuc T Dang

(74) *Attorney, Agent, or Firm* — Birch, Stewart, Kolasch & Birch, LLP

(57) ABSTRACT

A light emitting display device can include a first thin film transistor including a first semiconductor pattern, a first gate electrode, and first source and drain electrodes; a second thin film transistor including a second semiconductor pattern, a second gate electrode, and second source and drain electrodes; a storage capacitor including a first storage capacitor electrode and a second storage capacitor electrode; and a light emitting element layer electrically connected to the second thin film transistor. The first storage capacitor electrode can be disposed in the same layer as the first gate electrode, and the second storage capacitor electrode can be disposed in the same layer as the second gate electrode.

22 Claims, 8 Drawing Sheets

(56)                    References Cited

U.S. PATENT DOCUMENTS

2022/0109042  A1*    4/2022   Kim ..................... H10K 59/131
2022/0406740  A1*   12/2022  Kim ........................ H01L 24/04

FOREIGN PATENT DOCUMENTS

KR      10-2020-0100890  A      8/2020
KR           10-2345938  B1     1/2022
KR           20220001837  A   *   1/2022   ........... G09G 3/3225

* cited by examiner

FIG.1

LIGHT EMITTING DISPLAY DEVICE HAVING THIN FILM TRANSISTORS COMPONENTS IN DIFFERENT LAYERS

CROSS-REFERENCE TO RELATED APPLICATION

This application claims priority to Korean Patent Application No. 10-2022-0034487, filed on Mar. 21, 2022, in the Republic of Korea, the entire contents of which are hereby expressly incorporated by reference into the present application.

BACKGROUND

Technical Field

The present disclosure relates to electronic devices with displays, and more particularly, to a light emitting display device including a plurality of thin film transistors capable of simplifying processes and improving driving stability of the light emitting display device.

Discussion of the Related Art

Recently, display devices have increasingly been in demand to have various sizes, various shapes, and various functions to present various information and to allow users to interact with the display devices for operations related to such information.

Such display devices can include a liquid crystal display (LCD) device, an electrophoretic display (FPD) device, and a light emitting display device, and the like. The light emitting display device can include, for example, a light emitting diode (LED) display device, an organic light emitting diode (OLED) display device, and the like.

In particular, the light emitting display device has a self-emissive property, and can be thinner and lighter because it does not require a separate back light, compared with other types of display devices, such as a liquid crystal display (LCD) device.

Further, the light emitting display device consumes much less power due to a low operating voltage characteristic, and has excellent color reproduction, a faster response speed, a wider viewing angle, and a higher contrast ratio. Due to such excellent performance, work has been progressing on developing such light emitting display devices capable of providing a variety of advantages as the next generation display.

In instances where the light emitting display device is an organic light emitting diode display device, a light emitting element layer included in the organic light emitting diode display device can be an organic light emitting element layer including an anode, an emission layer, and a cathode. Further, a quantum dot light emitting diode (QLED) including a quantum dot (QD) as another type of light emitting element layer can be used in such a light emitting display device.

Hereinafter, for convenience of explanation, descriptions that follow will be provided based on organic light emitting diode display devices as light emitting display devices. However, light emitting element layers or light emitting display devices according to embodiments of the present disclosure are not limited thereto.

An organic light emitting diode display device can present information on a screen by allowing a plurality of pixels each including a light emitting element layer including an emission layer to emit light. The organic light emitting diode display device are typically divided into an active matrix type organic light emitting diode (AMOLED) display device or a passive matrix type organic light emitting diode (PMOLED) display device according to schemes of driving pixels.

The active matrix type organic light emitting diode (AMOLED) display device can display an image by controlling current flowing through an organic light emitting diode using one or more thin film transistors (TFT).

The active matrix type organic light emitting diode display device can include various thin film transistors, such as a switching thin film transistor, a driving thin film transistor connected to the switching thin film transistor, and the like, an organic light emitting diode (OLED) connected to the driving thin film transistor, and the like.

A plurality of driving circuits can be disposed in a display area of a substrate to control the operation of a plurality of light emitting element layers. The light emitting element layers can be electrically connected to the driving circuits. The driving circuits can supply driving currents corresponding to data signals to the light emitting element layers according to scan signals. For example, the driving circuits can include a plurality of thin film transistors and at least one storage capacitor.

The plurality of thin film transistors can include different types of semiconductor patterns or hybrid-type thin film transistors. In this instance, since different types of semiconductor patterns, for example, a polycrystalline semiconductor pattern including a low temperature poly-silicon (LTPS) material and an oxide semiconductor pattern including oxide are used, the process of forming a thin film transistor including such a polycrystalline semiconductor pattern and the process of forming a thin film transistor including the oxide semiconductor pattern are needed to be performed separately. As a result, the number of processes can be increased, and the performing of the processes can become complicated. Different characteristics with respect to chemical gases between the polycrystalline semiconductor pattern and the oxide semiconductor pattern can require the implementation of a more complicated process.

In addition, in order for such a light emitting display device to be applied to electronic devices such as a smart watch in which still images are primarily displayed on a display screen, leakage current can be caused in a situation where such still images are displayed, which can result in high power consumption.

Although work has been progressing on developing light emitting display devices capable of simplify a manufacturing process and improving the stability of thin film transistors included therein, however, there is still a need for an improved satisfactory light emitting display device that addresses the issues discussed above.

The description provided in the background section should not be assumed to be prior art merely because it is mentioned in or associated with the background section. The background section can include information that describes one or more aspects of the subject technology.

SUMMARY OF THE DISCLOSURE

To address these issues, one or more embodiments of the present disclosure can provide a light emitting display device that includes a plurality of thin film transistors, and at least one storage capacitor, which are disposed in such a manner that one or more electrodes of the at least one storage capacitor are disposed together with one or more electrodes of the thin film transistors, and is capable of reducing the number of processes of the thin film transistors and the at least one storage capacitor.

One or more embodiments of the present disclosure can provide a light emitting display device including a shielding layer disposed in a lower location than a plurality of thin film transistors in the display device stack in order to enhance the stability of the thin film transistors and thereby improve display quality when being driven.

One or more embodiments of the present disclosure can provide a light emitting display device allowing a distance between at least one shielding layer disposed in a lower location than a driving thin film transistor including an oxide semiconductor pattern and the oxide semiconductor pattern to be less than a distance between another shielding layer disposed in a lower location than another thin film transistor and an semiconductor pattern included in the other thin film transistor in order to eliminate or reduce display artifacts such as screen stains occurring in low grayscales caused by the driving thin film transistor.

According to one aspect of present disclosure, a light emitting display device includes: a first thin film transistor including a first semiconductor pattern, a first gate electrode, and first source and drain electrodes; a second thin film transistor including a second semiconductor pattern, a second gate electrode, and second source and drain electrodes; a storage capacitor including a first storage capacitor electrode and a second storage capacitor electrode; and a light emitting element layer electrically connected to the second thin film transistor, wherein the first storage capacitor electrode can be disposed in the same layer as the first gate electrode, and the second storage capacitor electrode can be disposed in the same layer as the second gate electrode.

According to another aspect of present disclosure, a light emitting display device includes: a first thin film transistor including a first semiconductor pattern, a first gate electrode, and first source and drain electrodes; a second thin film transistor including a second semiconductor pattern, a second gate electrode, and second source and drain electrodes; and a storage capacitor including a first storage capacitor electrode and a second storage capacitor electrode, wherein a layer in which the second semiconductor pattern is disposed can be located between a layer in which the first storage capacitor electrode is disposed and a layer in which the second storage capacitor electrode is disposed.

According to yet another aspect of present disclosure, a light emitting display device includes: a switching thin film transistor comprising a polycrystalline semiconductor pattern, a first gate electrode, and first source and drain electrodes; a driving thin film transistor comprising a oxide semiconductor pattern, a second gate electrode, and second source and drain electrodes; a storage capacitor including a first storage capacitor electrode and a second storage capacitor electrode; a first shielding layer disposed under the polycrystalline semiconductor pattern and at least partially overlapping the polycrystalline semiconductor pattern; and a second shielding layer disposed under the oxide semiconductor pattern and at least partially overlapping the oxide semiconductor pattern, wherein a first vertical distance between first shielding layer disposed and the polycrystalline semiconductor pattern is larger than a second vertical distance between the second shielding layer disposed and the oxide semiconductor pattern.

According to one or more embodiments of the present disclosure, a light emitting display device can be provided that is capable of reducing the number of processes and manufacturing cost by disposing a plurality of thin film transistors and at least one storage capacitor in the light emitting display device in such a manner that one or more electrodes of the at least one storage capacitor are disposed together with one or more electrodes of the thin film transistors.

According to one or more embodiments of the present disclosure, a light emitting display device can be provided that is capable of enhancing the stability of different types of thin film transistors and thereby improve display quality when being driven by designing one or more shielding layers to be disposed in a lower location than the thin film transistors.

According to one or more embodiments of the present disclosure, a light emitting display device can be provided that is capable of eliminating or reducing display artifacts such as screen stains occurring in low grayscales caused by a driving thin film transistor including an oxide semiconductor pattern by designing a distance between a shielding layer disposed in a lower location than the driving thin film transistor including the oxide semiconductor pattern and the oxide semiconductor pattern to be less than a distance between another shielding layer disposed in a lower location than another thin film transistor and an semiconductor pattern included in the other thin film transistor, and thereby, leading a current variance rate of the driving thin film transistor including the oxide semiconductor pattern to become small.

Additional features and aspects will be set forth in part in the description which follows and in part will become apparent from the description or can be learned by practice of the inventive concepts provided herein. Other features and aspects of the inventive concepts can be realized and attained by the structure particularly pointed out in, or derivable from, the written description, the claims hereof, and the appended drawings. Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 1 is a block diagram of an example light emitting display device according to aspects of the present disclosure;

DETAILED DESCRIPTION OF THE EMBODIMENTS

Figure 2:
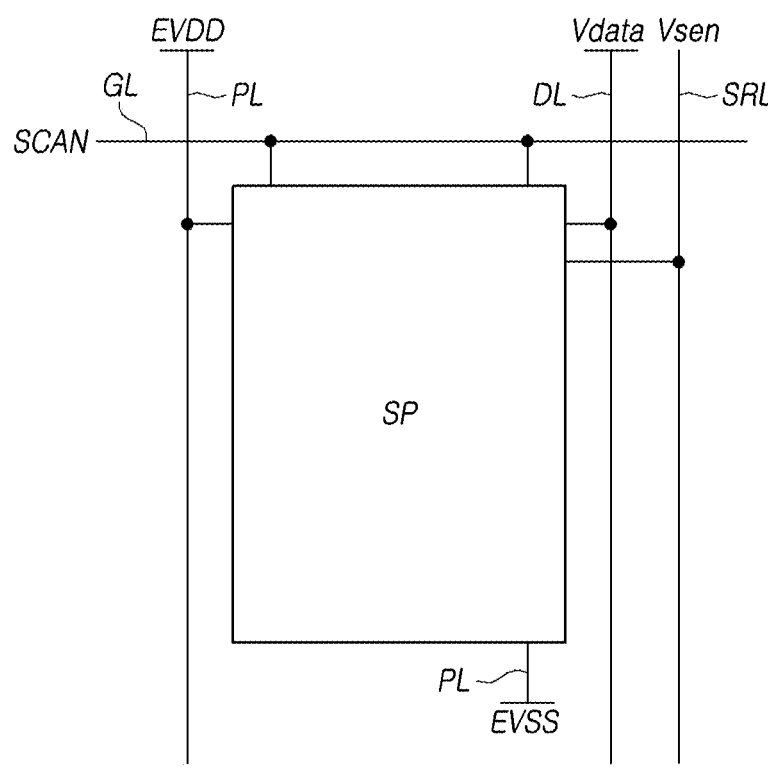
FIG. 2 illustrates an example subpixel of the light emitting display device according to aspects of the present disclosure.

Reference will now be made in detail to embodiments of the present disclosure, examples of which can be illustrated in the accompanying drawings. In the following description, structures, embodiments, implementations, methods and operations described herein are not limited to the specific example or examples set forth herein and can be changed as is known in the art, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

Shapes, sizes, ratios, angles, numbers, and the like, which are illustrated in the drawings to describe various example embodiments of the present disclosure are merely given by way of example. Therefore, the present disclosure is not limited to the illustrations in the drawings. Like reference numerals designate like elements throughout, unless otherwise specified. Names of the respective elements used in the following explanations are selected only for convenience of writing the specification and can thus be different from those used in actual products. In the following description, where the detailed description of the relevant known function or configuration can unnecessarily obscure aspects of the present disclosure, a detailed description of such known function or configuration can be omitted. Where the terms "comprise," "have," "include," "contain," "constitute," "make up of," "formed of," and the like are used, one or more other elements can be added unless the term such as "only," is used. An element described in the singular form is intended to include a plurality of elements, and vice versa, unless the context clearly indicates otherwise.

In construing an element, the element is to be construed as including an error or tolerance range margin of error even where no explicit description of such an error or tolerance range is provided. Further, the term "may" fully encompasses all the meanings of the term "can".

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom, "downward," "upward," "upper," "lower," and the like refer to an arbitrary frame of reference.

Time relative terms, such as "after", "subsequent to", "next to", "before", or the like, used to describe a temporal relationship between events, operations, or the like are generally intended to include events, situations, cases, operations, or the like that do not occur consecutively unless the terms, such as "directly", "immediately", or the like, are used.

Although the terms "first," "second," and the like can be used herein to describe various elements, these elements should not be interpreted to be limited by these terms. These terms are used only to distinguish one element from another. For example, a first element could be termed a second element, and, similarly, a second element could be termed a first element, without departing from the scope.

The terms "first," "second," "A", "B", "(a)", or "(b)", and the like can be used herein to describe various elements of the present disclosure. These terms are used only to distinguish one element from another; thus, related elements should not be interpreted to be limited by these terms as they are not used to define a particular order, sequence or precedence.

Further, the expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C. For the expression that an element or layer "connect," "couple," "combine," "contacts," "overlaps," or the like with another element or layer, the element or layer can not only directly connect, couple, combine, contact, overlap, or the like with another element or layer, but indirectly connect, couple, combine, contact, overlap, or the like with another element or layer with one or more intervening elements or layers "disposed" or "interposed" between the elements or layers, unless otherwise specified.

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The term "device" used herein can include a device (or apparatus) or a display device (or display apparatus) such as a liquid crystal module (LCM), an organic light emitting display module (OLED module), or the like including a display panel and a driver or driving circuit for driving the display panel. Further, the device or the display device can include a notebook computer, a television, a computer monitor, a vehicle or automotive apparatus, an equipment apparatus including one or more other elements of a vehicle, and a set electronic apparatus such as a mobile electronic apparatus (such as a smartphone, an electronic pad, and the like, or including a smartphone, an electronic pad, and the like), and the like, or a set apparatus (or a set device), which are complete products or final products including the LCM, the OLED module, and the like.

Accordingly, the device in the present disclosure can include a display device (or a display apparatus) itself such as an LCM, an OLED module, and the like, and an application product including the LCM, the OLED module, and the like, or a set device (or a set apparatus) that is a device (or an apparatus) for end consumers.

Further, in some embodiments of the present disclosure, an LCM, an OLED module, or the like including a display panel, a driving circuit, and the like can be expressed or considered as a "display device," and an electronic device as a complete product (or a final product) including the LCM, the OLED module, and the like can be expressed or considered as a "set device" for distinction between them. For example, a display device can include a display panel in which a liquid crystal (LCD) or an organic light emitting diode (OLED) is disposed, and a source printed circuit board (PCB) that is a controller for driving the display panel. Further, a set device can further include a set PCB that is a set controller electrically connected to the source PCB and configured to drive the entire operation of the set device.

The term "display panel" used herein can include any type of display panels such as a liquid crystal display panel, an organic light emitting diode (OLED) display panel, an electroluminescent display panels, and other types of display panels. However, embodiments of the present disclosure are not limited thereto. For example, a display panel can be a device capable of generating sound by being vibrated by a vibration device according to one or more embodiments of the present disclosure. A display panel applied to a display device according to aspects of the present disclosure is not limited to a specific shape or size.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified.

Hereinafter, discussions on example embodiments of the present disclosure will be provided with reference to the accompanying drawings. In addition, for convenience of description, a scale in which each of elements is illustrated in the accompanying drawings can differ from an actual scale. Thus, the illustrated elements are not limited to the specific scale in which they are illustrated in the drawings.

Hereinafter, various example embodiments of the present disclosure will be described in detail with reference to the drawings. All the components of each light emitting display device according to all embodiments of the present disclosure are operatively coupled and configured.

Figure 1:
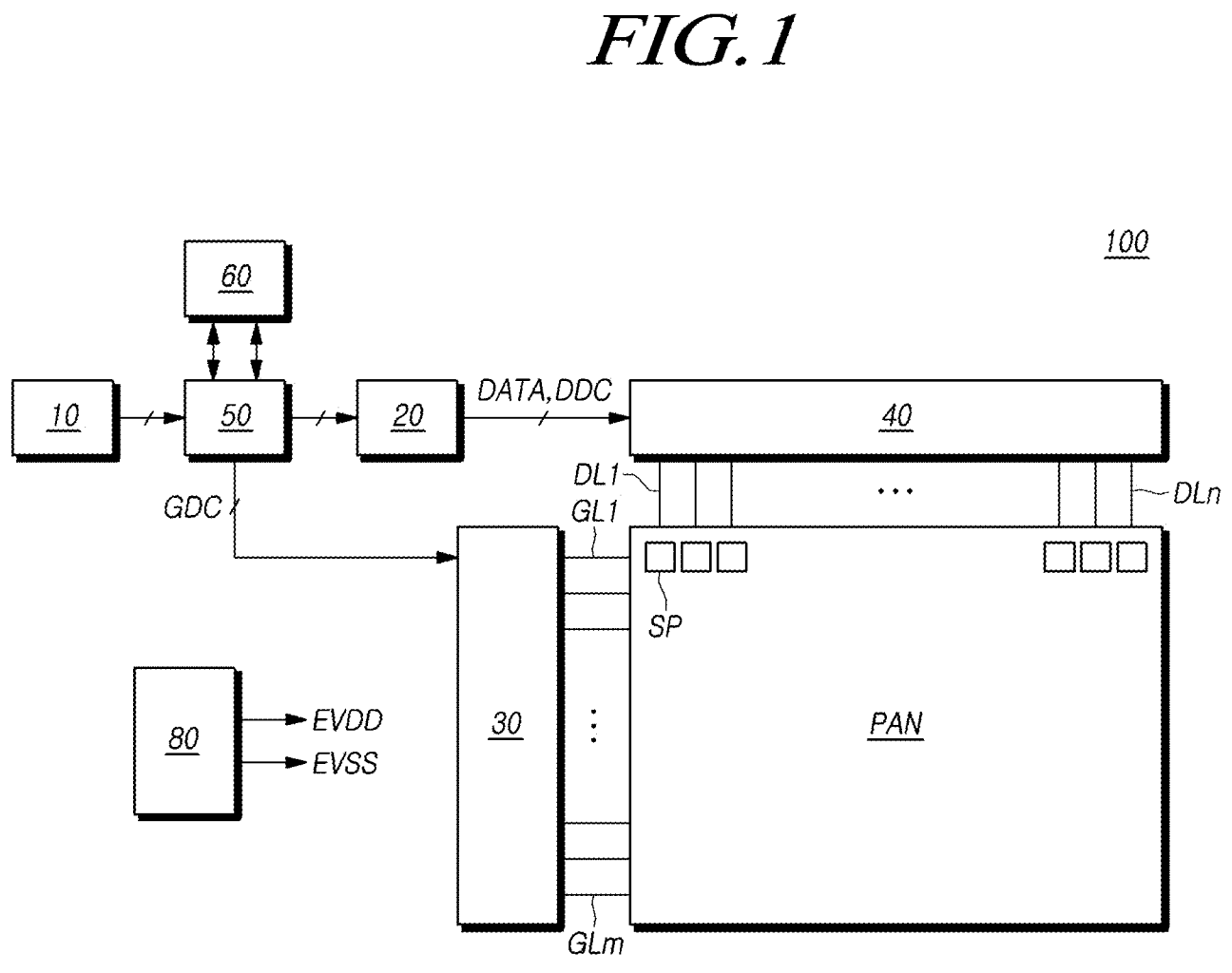

FIG. 1 is a block diagram of an example light emitting display device according to aspects of the present disclosure.

Referring to FIG. 1, a light emitting display device 100 according to aspects of the present disclosure can include a display panel PAN, an image processor 10 configured to transmit signals to the display panel PAN, a degradation compensator 50, a memory 60, a timing controller 20, a data driver 40, a power supply 80, and a gate driver 30.

The image processor 10 can output driving signals or control signals for driving or controlling various elements or devices in addition to image data received from an external source. For example, such driving signals or control signals output from the image processor 10 can include a data enable signal, a vertical synchronization signal, a horizontal synchronization signal, a clock signal, and the like.

The degradation compensator 50 can calculate a degradation compensation gain value of a subpixel SP of the display panel based on a sensing voltage Vsen supplied by the data driver 40, calculate a dimming weight value based on the calculated degradation compensation gain value, modulate input image data Idata of each subpixel SP in a current frame using the degradation compensation gain value and the dimming weight value, and supply the modulated image data Mdata to the timing controller 20.

The timing controller 20 can receive a driving signal and the like in addition to the modulated image data from the degradation compensator 50. The timing controller 20 can generate and supply a gate timing control signal GDC for controlling an operation time of the gate driver 30 and a data timing control signal DDC for controlling an operation time of the data driver 40 based on one or more driving signals provided by the image processor 10.

The timing controller 20 can acquire at least one sensing voltage Vsen from each subpixel SP by controlling the operation times of the gate driver 30 and the data driver 40, and supply the acquired sensing voltage Vsen to the degradation compensator 50.

The gate driver 30 can output at least one scan signal to the display panel PAN in response to a gate timing control signal GDC supplied by the timing controller 20. The gate driver 30 can supply scan signals through a plurality of gate lines GL1 to GLm. The gate driver 30 can be implemented, for example, in the form of an integrated circuit (IC); however, examples of the gate driver 30 are not limited thereto. The gate driver 30 can be implemented, for example, in a gate in panel (GIP) structure in which one or more thin film transistors are directly stacked over a substrate of the light emitting display device 100. The gate driver 30 implemented in the GIP structure can include a plurality of circuit elements such as a shift register, a level shifter, and the like.

The data driver 40 can output at least one data voltage to the display panel PAN in response to a data timing control signal DDC supplied by the timing controller 20. The data driver 40 can sample and latch a digital data signal DATA supplied by the timing controller 20, and convert the digital data signal DATA into an analog data voltage based on a gamma voltage. The data driver 40 can supply data voltages through a plurality of data lines DL1 to DLn.

The data driver 40 can supply a sensing voltage Vsen received from the display panel PAN through a sensing voltage readout line to the degradation compensator 50. The data driver 40 can be, for example, mounted on the display panel PAN in the form of an integrated circuit (IC), or directly formed in the display panel PAN by being stacked with several types of patterns; however, examples of the data driver 40 are not limited thereto.

Degradation compensation times of light emitting element layers of subpixels SP as well as a look-up table for degradation compensation gains can be stored in the memory 60. The degradation compensation times of the light emitting element layers can be, for example, times or the number of times of driving the light emitting display device.

The power supply 80 can output a high level driving voltage EVDD and a low level driving voltage EVSS to be supplied to the display panel PAN. The high level driving voltage EVDD and the low level driving voltage EVSS can be supplied to the display panel PAN through one or more power lines. The voltages output from the power supply 80 can be supplied to the data driver 40 or the gate driver 30 for enabling the data driver 40 or the gate driver 30 to be driven.

Figure 3:
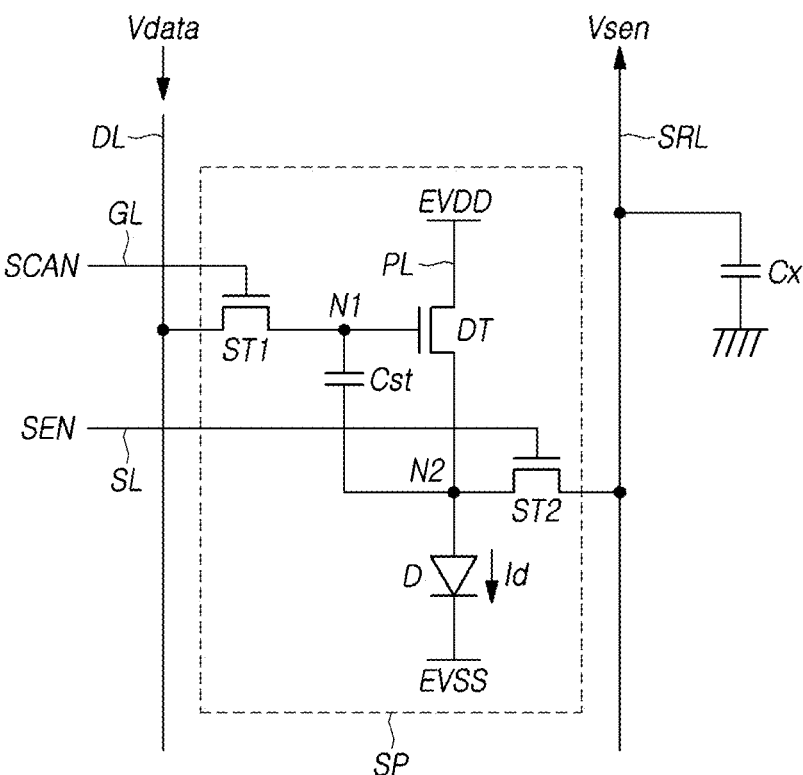
FIG. 3 illustrates an example circuit of the subpixel of the light emitting display device according to aspects of the present disclosure.

FIGS. 2 and 3 illustrate circuit elements related to the driving of the light emitting display device according to aspects of the present disclosure.

Particularly, FIG. 2 illustrates an example subpixel of the light emitting display device according to aspects of the present disclosure. FIG. 3 illustrates an example circuit of the subpixel of the light emitting display device according to aspects of the present disclosure.

Although FIG. 3 illustrates the organic light emitting display device 100 having a structure including three thin film transistors (T) and one storage capacitor (C) (which can be referred to as a 3T1C structure) as an example, the structures of the organic light emitting display device 100 according to aspects of the present disclosure are not limited to the specific structure. For example, the organic light emitting display device 100 according to aspects of the present disclosure can have one or more of various structures such as 4T1C, 5T1C, 6T1C, 7T1C, 8T1C, 4T2C, 5T2C, 6T2C, 7T2C, 8T2C and the like.

Referring to FIGS. 2 and 3, the organic light emitting display device 100 according to aspects of the present disclosure can include one or more gate lines GL, one or more data lines DL, one or more power lines PL, and one or more sensing lines SL. Each subpixel included in the display device can include a first switching thin film transistor ST1, a second switching thin film transistor ST2, a driving thin film transistor DT, an organic light emitting element D such as an organic light emitting diode, and a storage capacitor Cst.

The organic light emitting element D can include an anode electrode connected to a second node N2, a cathode electrode connected to a low level voltage supply line, or a terminal of a low level voltage supply, for supplying a low level driving voltage EVSS, and a light emitting element layer located between the anode electrode and the cathode electrode.

The driving thin film transistor DT can control a current Id flowing through the organic light emitting element D according to a voltage Vgs between the gate and source of the driving thin film transistor DT. The driving thin film transistor DT can include a gate electrode connected to a first node N1, a drain electrode connected to the power line PL, to which a high level driving voltage EVDD is applied, and a source electrode connected to the second node N2.

The storage capacitor Cst can be connected between the first node N1 and the second node N2. The storage capacitor Cst can maintain a predefined voltage for one frame.

The first switching thin film transistor ST1 can apply a data voltage Vdata loaded on a data line DL to the first node N1 in response to a gate signal SCAN when the display panel PAN is driven, and thereby, enable the driving thin film transistor DT to turn on. The first switching thin film transistor ST1 can include a gate electrode connected to the gate line GL, to which the gate signal SCAN is applied, a drain electrode connected to the data line DL, to which a data voltage Vdata is applied, and a source electrode connected to the first node N1.

The second switching thin film transistor ST2 can enable a source voltage at the second node N2 to be stored in a sensing capacitor Cx of a sensing voltage readout line by switching a current between the second node N2 and the sensing voltage readout line SRL in response to a sensing signal SEN. The second switching thin film transistor ST2 can reset the source voltage of the driving thin film transistor DT to an initialization voltage Vpre by switching a current between the second node N2 and the sensing voltage readout line SRL in response to the sensing signal SEN when the display panel PAN is driven. The gate, drain, and source electrodes of the second switching thin film transistor ST2 can be connected to the sensing line SL, the second node N2, and the sensing voltage readout line SRL, respectively.

Figure 4:
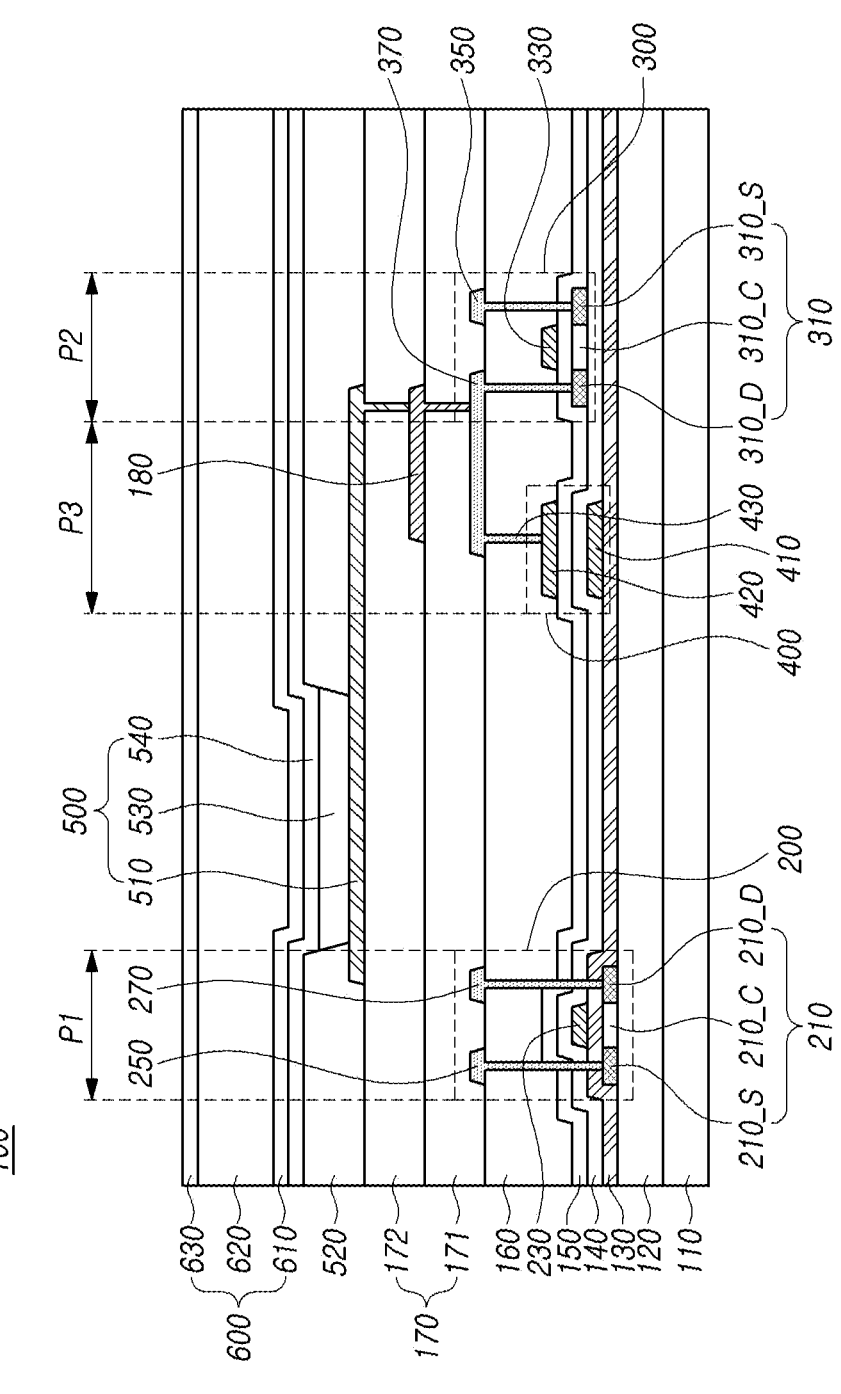
FIG. 4 is an example cross-sectional view of the light emitting display device according to aspects of the present disclosure.

FIG. 4 is an example cross-sectional view of the light emitting display device according to aspects of the present disclosure.

Referring to FIG. 4, the light emitting display device 100 according to aspects of the present disclosure can include a substrate 110, a first thin film transistor 200, a second thin film transistor 300, and a storage capacitor 400.

The first thin film transistor 200, the second thin film transistor 300, and the storage capacitor 400 can be disposed on the substrate 110 such that the first thin film transistor 200, the second thin film transistor 300, and the storage capacitor 400 are disposed in a first area P1, a second area P2, and a third area P3 of the substrate 110.

The first area P1, the second area P2, and the third area P3 can be different areas from one another defined on the substrate 110. The first area P1, the second area P2, and the third area P3 can be disposed in a display area (or an active area) or a non-display area (or an inactive area). For example, the first thin film transistor 200 and the second thin film transistor 300 can be disposed in the non-display area and the display area, respectively; however, examples of the first thin film transistor 200 and the second thin film transistor 300 are not limited thereto.

In another example, the first area P1, the second area P2, and the third area P3 can be disposed in the display area. For example, the first thin film transistor 200, the second thin film transistor 300, and the storage capacitor 400 can be disposed in a single subpixel SP. The first thin film transistor 200 can be referred to as a switching thin film transistor. The second thin film transistor 300 can be referred to as a driving thin film transistor.

The storage capacitor 400 can store a data voltage applied through a data line for a predefined time and then provide the stored voltage to a light emitting element layer 500.

Various elements or stacks of the light emitting display device can be disposed on the substrate 110. The substrate 110 can include a plastic material with flexibility. For example, the substrate 110 can include one or more of polyimide, polyethersulfone, polyethylene terephthalate, and polycarbonate, but examples of the substrate 110 are not limited thereto. In an example where the substrate 110 includes a plastic material, the process of manufacturing the light emitting display device can be performed in a situation where a support substrate including glass is disposed under the substrate 110, and after the manufacturing process is completed, the support substrate can be released. Further, after the support substrate is released, a back plate for supporting the substrate 110 can be disposed under the substrate 110.

In an example where the substrate 110 includes a plastic material, moisture can penetrate the substrate 110, and the penetration of moisture can proceed up to a thin film transistor or a light emitting element layer, thus leading the performance of the display device to be reduced. The light emitting display device according to aspects of the present disclosure can include two substrates including a plastic material to prevent the performance of the display device from being reduced due to moisture penetration. Further, an inorganic layer can be interposed between the two substrates. Thereby, moisture penetration can be shielded, and as a result, the performance and reliability of the display device can be improved. The inorganic layer can be formed of, for example, a single layer including silicon nitride (SiNx) or silicon oxide (SiOx) or a multilayer including silicon nitride (SiNx) and/or silicon oxide (SiOx). However, examples of the inorganic layer are not limited thereto.

The substrate 110 can sometimes refer to a generic element including several elements and functional layers disposed on the substrate, for example, a switching thin film transistor, a driving thin film transistor connected to the switching thin film transistor, an organic light emitting element connected to the driving thin film transistor, a protective layer, and the like; however, configurations of the substrate 110 are not limited thereto.

A buffer layer 120 can be disposed on the entire surface of the substrate 110. The buffer layer 120 can improve adhesion between layers disposed on the buffer layer and the substrate, and serve to prevent various types of defects such as alkali components moving from the substrate 110. The buffer layer 120 can also serve to delay the diffusion of moisture or oxygen having penetrated into the substrate 110.

The buffer layer 120 can be formed of, for example, a single layer including silicon nitride (SiNx) or silicon oxide (SiOx) or a multilayer including silicon nitride (SiNx) and/or silicon oxide (SiOx). In an example where the buffer layer includes a multilayer, silicon oxide (SiOx) and silicon nitride (SiNx) can be alternately disposed.

The buffer layer 120 can be omitted based on the type and material of the substrate 110, the structures and types of thin film transistors, and the like.

The first semiconductor pattern 210 of the first thin film transistor 200 can be disposed on the buffer layer 120 in the first area P1.

A layer in which the first semiconductor pattern 210 is disposed can be a layer other than a layer between a layer in which the first storage capacitor electrode 410 is disposed and a layer in which the second storage capacitor electrode 420 is disposed.

The first semiconductor pattern 210 can include a polycrystalline semiconductor. For example, the polycrystalline semiconductor can include low temperature poly silicon (LTPS) having high mobility. The first semiconductor pattern 210 including such a polycrystalline semiconductor provides advantages of low energy consumption power and excellent reliability.

In another example, the first semiconductor pattern 210 can include amorphous silicon (a-Si) or various organic semiconductor materials such as pentacene. In further another example, the first semiconductor pattern 210 can include oxide. However, examples of the first semiconductor pattern 210 are not limited thereto.

After an amorphous silicon (a-Si) material is deposited on the buffer layer 120, polysilicon can be formed by performing a dehydrogenation process, a crystallization process, an activation process, and a hydrogenation process, and thereafter, the first semiconductor pattern 210 can be formed by patterning the polysilicon.

The first semiconductor pattern 210 can include a first channel region 210_C, of which a doping process is not performed, forming a channel through which electrons or holes move in the first semiconductor pattern 210 when the first thin film transistor 200 is driven. Further, the first channel region 210_C can be disposed such that it overlaps a first gate electrode 230.

A first source region 210_S and a first drain region 210_D, which become conductive by a doping process, can be disposed on both sides of the first channel region 210_C. The first source region 210_S can refer to a portion of the first semiconductor pattern 210 connected to a first source electrode 250, and the first drain region 210_D can refer to a portion of the first semiconductor pattern 210 connected to a first drain electrode 270.

The first source region 210_S and the first drain region 210_D can be formed by doping ions into a polycrystalline silicon material.

The first source region 210_S and the first drain region 210_D can be regions modified to become conductive by implanting one of elements of group 3 or group 5 into the polycrystalline semiconductor material. For example, the first source region 210_S and the first drain region 210_D can include phosphorus (P) or boron (B).

When a semiconductor pattern of a thin film transistor is manufactured with a polycrystalline semiconductor material, characteristics of the polycrystalline semiconductor material can be reduced when vacancies exist. Therefore, the characteristics of the semiconductor pattern can be improved by causing hydrogen included in an insulating layer such as silicon nitride (SiNx) to diffuse into the polycrystalline semiconductor material through a heat treatment process, and the hydrogen to fill vacancies existing in the polycrystalline semiconductor material. For example, the insulating layer such as silicon nitride (SiNx) can contain a large amount of hydrogen particles during a manufacturing process. As hydrogen included in the insulating layer such as silicon nitride (SiNx) is diffused into the first semiconductor pattern 210 including a polycrystalline semiconductor pattern by a heat treatment, the hydrogen can be filled in vacancies existing in the polycrystalline semiconductor material, and thereby, the characteristics of the first semiconductor pattern 210 can be improved. As a result, the first semiconductor pattern 210 can be stabilized.

A first insulating layer 130 can be disposed on the first semiconductor pattern 210. The first insulating layer 130 can be disposed between the first semiconductor pattern 210 of the first thin film transistor 200 and the first gate electrode 230. Thus, the first insulating layer 130 can insulate between the first semiconductor pattern 210 and the first gate electrode 230.

The first insulating layer 130 can include an insulating material such as silicon nitride (SiNx) or silicon oxide (SiOx), an insulating organic material, or the like. The first insulating layer 130 can include holes to electrically connect each of the first source electrode 250 and the first drain electrode 270 to the first semiconductor pattern 210.

The first gate electrode 230 of the first thin film transistor 200 and the first storage capacitor electrode 410 of the storage capacitor 400 can be disposed on the first insulating layer 130 such that the first gate electrode 230 and the first storage capacitor electrode 410 are disposed in the first area P1 and the third area P3, respectively.

The first gate electrode 230 can be disposed such that it overlaps the first semiconductor pattern 210.

The first gate electrode 230 and the first storage capacitor electrode 410 can be formed of a single layer including one, or a multilayer including two or more, of molybdenum (Mo), copper (Cu), titanium (Ti), aluminum (Al), chromium (Cr), gold (Au), nickel (Ni), neodymium (Nd), or tungsten (W), or one or more alloys including one or more of molybdenum (Mo), copper (Cu), titanium (Ti), aluminum (Al), chromium (Cr), gold (Au), nickel (Ni), neodymium (Nd), or tungsten (W). However, embodiments of the first gate electrode 230 and the first storage capacitor electrode 410 are not limited thereto.

A first interlayer insulating layer 140 can be disposed on the first gate electrode 230 and the first storage capacitor electrode 410.

By disposing the first interlayer insulating layer 140 between the first semiconductor pattern 210 and the first gate electrode 230 and the second semiconductor pattern 310, any of the semiconductor patterns 210 and 310 can be protected from a process required for forming the other of the semiconductor patterns 210 and 310, and thereby, the display quality and stability of the light emitting display device can be improved. For example, the semiconductor patterns can be respectively disposed in upper and lower portions of the first interlayer insulating layer 140. Therefore, even when different types of semiconductor patterns are used, any of the semiconductor patterns can be protected in the process of manufacturing a thin film transistor including the other of the semiconductor patterns.

The first interlayer insulating layer 140 can be disposed between the first storage capacitor electrode 410 and the second storage capacitor electrode 420 in the third area P3.

The first interlayer insulating layer 140 can include an insulating material such as silicon nitride (SiNx) or silicon oxide (SiOx), an insulating organic material, or the like.

The first interlayer insulating layer 140 can be formed of, for example, a single layer including silicon nitride (SiNx) or silicon oxide (SiOx) or a multilayer including silicon nitride (SiNx) and/or silicon oxide (SiOx). However, examples of the first interlayer insulating layer 140 are not limited thereto.

The first interlayer insulating layer 140 can include holes to electrically connect each of the first source electrode 250 and the first drain electrode 270 to the first semiconductor pattern 210.

The second semiconductor pattern 310 of the second thin film transistor 300 can be disposed on the first interlayer insulating layer 140 in the second area P2.

A layer in which the second semiconductor pattern 310 is disposed can be located between a layer in which the first storage capacitor electrode 410 is disposed and a layer in which the second storage capacitor electrode 420 is disposed.

The second semiconductor pattern 310 can include an oxide semiconductor. When a polycrystalline semiconductor pattern, which is advantageous for high-speed operation, is used as a semiconductor pattern included in a driving thin film transistor, leakage current can be caused in an off state, thus resulting in high power consumption. Accordingly, oxide, which is advantageous for preventing leakage current, can be used to form a semiconductor pattern.

Since an oxide semiconductor material has a band gap greater than a silicon semiconductor material, electrons cannot jump a band gap in an off state, and as a result, an off-current is relatively low.

Such an off-current can be a leakage current flowing between source and drain electrodes of a TFT when the TFT is off. When a driving thin film transistor includes an oxide semiconductor material having a low off-current, since the effect of preventing leakage current is excellent even when the off-state is long, a change in luminance of subpixels during low-speed driving can be minimized. Further, since the leakage current is low in the off-state, power consumption can be reduced.

The second semiconductor pattern 310 can include a metal oxide. For example, the second semiconductor pattern 310 can include any one of indium-gallium-zinc-oxide (IGZO), indium-zinc-oxide (IZO), indium-gallium-tin-oxide (IGTO), and indium-gallium-oxide (IGO). However, examples of the second semiconductor pattern 310 are not limited thereto.

Conductive characteristics of the metal oxide material can be improved by a doping process in which impurities are implanted.

The second semiconductor pattern 310, can include a second channel region 310_C, of which a doping process is not performed, forming a channel through which electrons or holes move in the second semiconductor pattern 310 when the second thin film transistor 300 is driven. Further, the second channel region 310_C can be disposed such that it overlaps a second gate electrode 330.

A second source region 310_S and a second drain region 310_D, which become conductive by a doping process, can be disposed on both sides of the second channel region 310_C. The second source region 310_S can refer to a portion of the second semiconductor pattern 310 connected to a second source electrode 350, and the second drain region 310_D can refer to a portion of the second semiconductor pattern 310 connected to a second drain electrode 370.

The second source region 310_S and the second drain region 310_D can be formed by a doping process in which one of elements of group 3 such as boron is implanted into a metal oxide material.

A second insulating layer 150 can be disposed on the first interlayer insulating layer 140 and the second semiconductor pattern 310.

The second insulating layer 150 can be disposed between the second semiconductor pattern 310 and the second gate electrode 330 in the second area P2. The second insulating layer 150 can insulate the second gate electrode 330 from the second semiconductor pattern 310.

The second insulating layer 150 can be disposed between the first storage capacitor electrode 410 and the second storage capacitor electrode 420 in the third area P3.

The second insulating layer 150 can include an insulating material such as silicon nitride (SiNx) or silicon oxide (SiOx), an insulating organic material, or the like.

The second insulating layer 150 can include holes to electrically connect each of the first source electrode 250 and the first drain electrode 270 to the first semiconductor pattern 210. The second insulating layer 150 can include holes to electrically connect each of the second source electrode 350 and the second drain electrode 370 to the second semiconductor pattern 310.

The second gate electrode 330 and the second storage capacitor electrode 420 can be disposed on the second insulating layer 150 such that the second gate electrode 330 and the second storage capacitor electrode 420 are disposed in the second area P2 and the third area P3, respectively.

The second gate electrode 330 and the second storage capacitor electrode 420 can be disposed on the second insulating layer 150 such that the second gate electrode 330 and the second storage capacitor electrode 420 overlap the second semiconductor pattern 310 and the first storage capacitor electrode 410, respectively.

The storage capacitor 400 can include two electrodes corresponding to each other and a dielectric interposed therebetween. The storage capacitor 400 can include the first storage capacitor electrode 410 and the second storage capacitor electrode 420. At least two insulating layers can be interposed between the first storage capacitor electrode 410 and the second storage capacitor electrode 420. For example, the first interlayer insulating layer 140 and the second insulating layer 150 can be disposed between the first storage capacitor electrode 410 and the second storage capacitor electrode 420.

The second storage capacitor electrode 420 can be electrically connected to the light emitting element layer 500 through the second drain electrode 370 or a first connection electrode 180.

The second storage capacitor electrode 420 of the storage capacitor 400 can be electrically connected to the second drain electrode 370. For example, the second storage capacitor electrode 420 can be electrically connected to the second drain electrode 370 through a second connection electrode 430.

While the light emitting display device is driven by signals applied through signal lines, there can occur voltage distortions of thin film transistors. To solve this problem, in one embodiment, the storage capacitor 400 can be connected to the second thin film transistor 300. In this embodiment, the storage capacitor 400 can store a data voltage applied through the data line for a predefined time, and thereby, serve to prevent voltage distortions caused by signal lines and enable a corresponding driving circuit to operate stably, when transistors including the second thin film transistor 300 are driven.

The second gate electrode 330 and the second storage capacitor electrode 420 can be formed of a single layer including one, or a multilayer including two or more, of molybdenum (Mo), copper (Cu), titanium (Ti), aluminum (Al), chromium (Cr), gold (Au), nickel (Ni), neodymium (Nd), or tungsten (W), or one or more alloys including one or more of molybdenum (Mo), copper (Cu), titanium (Ti), aluminum (Al), chromium (Cr), gold (Au), nickel (Ni), neodymium (Nd), or tungsten (W). However, embodiments of the second gate electrode 330 and the second storage capacitor electrode 420 are not limited thereto.

When one or more electrodes of different types of thin film transistors are disposed, the number of processes and manufacturing cost can be reduced by forming one or more electrodes of at least one storage capacitor 400 together or substantially simultaneously. For example, when the first gate electrode 230 of the first thin film transistor 200 in the first area P1 is disposed, the first storage capacitor electrode 410 in the third area P3 can be disposed together or substantially simultaneously. For example, when the second gate electrode 330 of the second thin film transistor 300 in the second area P2 is disposed, the second storage capacitor electrode 420 in the third area P3 can be disposed together or substantially simultaneously. Therefore, since one or more electrodes of the storage capacitor 400 do not need to be formed in a separate process, the number of processes and manufacturing cost can be reduced.

A second interlayer insulating layer 160 can be disposed on the second insulating layer 150, the second gate electrode 330, and the second storage capacitor electrode 420. The second interlayer insulating layer 160 can include an insulating material such as silicon nitride (SiNx) or silicon oxide (SiOx), an insulating organic material, or the like.

The second interlayer insulating layer 160 can include holes to electrically connect each of the first source electrode 250 and the first drain electrode 270 to the first semiconductor pattern 210.

The second interlayer insulating layer 160 can include holes to electrically connect each of the second source electrode 350 and the second drain electrode 370 to the second semiconductor pattern 310.

The second interlayer insulating layer 160 can include a hole to electrically connect between the second drain electrode 370 and the second storage capacitor electrode 420.

The first source electrode 250, the first drain electrode 270, the second source electrode 350, and the second drain electrode 370 can be disposed on the second interlayer insulating layer 160 such that the first source electrode 250 and the first drain electrode 270 are disposed in the first area P1, and the second source electrode 350 and the second drain electrode 370 are disposed in the second area P2.

The first source electrode 250 and the first drain electrode 270 disposed in the first area P1 can be electrically connected to the first semiconductor pattern 210 through holes formed in the first interlayer insulating layer 140, the second insulating layer 150, and the second interlayer insulating layer 160.

The second source electrode 350 and the second drain electrode 370 disposed in the second area P2 can be electrically connected to the second semiconductor pattern 310 through holes formed in the second insulating layer 150 and the second interlayer insulating layer 160.

The second connection electrode 430 can be disposed in the third area P3. The second connection electrode 430 can be disposed in the hole of the second interlayer insulating layer 160 and can electrically connect between the second storage capacitor electrode 420 and the second drain electrode 370.

The first source electrode 250, the first drain electrode 270, the second source electrode 350, the second drain electrode 370, and the second connection electrode 430 can be formed of a single layer including one, or a multilayer including two or more, of molybdenum (Mo), copper (Cu), titanium (Ti), aluminum (Al), chromium (Cr), gold (Au), nickel (Ni), or neodymium (Nd), or one or more alloys including one or more of molybdenum (Mo), copper (Cu), titanium (Ti), aluminum (Al), chromium (Cr), gold (Au), nickel (Ni), or neodymium (Nd). However, embodiments of the first source electrode 250, the first drain electrode 270, the second source electrode 350, and the second drain electrode 370 are not limited thereto. For example, the first source electrode 250, the first drain electrode 270, the second source electrode 350, the second drain electrode 370, and the second connection electrode 430 can be formed of a stack of three layers: titanium (Ti), aluminum (Al), and titanium (Ti). However, examples of the first source electrode 250, the first drain electrode 270, the second source electrode 350, the second drain electrode 370, and the second connection electrode 430 are not limited thereto.

A planarization layer 170 can be disposed on the first source electrode 250, the first drain electrode 270, the second source electrode 350, and the second drain electrode 370.

The planarization layer 170 can cover the first thin film transistor 200 and the second thin film transistor 300. The planarization layer 170 can protect the thin film transistors disposed below, and can serve to reduce or planarize steps caused by various patterns.

The planarization layer 170 can include, for example, one or more of organic insulating materials such as benzocyclobutene (BCB), acrylic resin, epoxy resin, phenolic resin, polyamide resin, or polyimide resin. However, examples of the planarization layer 170 are not limited thereto. For example, the planarization layer 170 can be formed of a single layer. In another example, the planarization layer 170 can be formed of two or more layers considering the arrangement of electrodes.

This example can be preferably considered in the light emitting display device 100 in instances where various signal lines are increasingly needed to provide a higher resolution. Thus, in this instance, an additional layer can be disposed because it is not easy to arrange all lines in one layer while each line maintains a minimum distance from one another. This additional layer can enable the lines to be arranged with predefined distances, and thus, help design for arranging lines and/or electrodes layout design to be easier.

In addition, in an example where the planarization layer 170 formed of a multilayer is implemented using a dielectric material, the planarization layer 170 can be used for forming capacitance between metal layers.

In an example where the planarization layer 170 formed of two layers is disposed, the planarization layer 170 can include a first planarization layer 171 and a second planarization layer 172.

The first connection electrode 180 can be disposed between the first planarization layer 171 and the second planarization layer 172.

In an embodiment, a hole can be formed in the first planarization layer 171, and the first connection electrode 180 can be disposed in the hole. The second thin film transistor 300 and the light emitting element layer 500 can be electrically connected through the first connection electrode 180.

For example, an edge (or a portion) of the first connection electrode 180 can be connected to the second thin film transistor 300, and another edge (or another portion) of the first connection electrode 180 can be connected to the light emitting element layer 500.

An anode electrode 510 can be disposed on the planarization layer 170. For example, the anode electrode 510 can be electrically connected to the second drain electrode 370 through a hole in the planarization layer 170. The anode electrode 510 can be electrically connected to the second drain electrode 370 through the first connection electrode 180.

The anode electrode 510 can supply holes to an emission layer 530 and can include a conductive material having a high work function.

In an example where the light emitting display device 100 has a top emission structure, the anode electrode 510 can be a reflective electrode reflecting light and include an opaque conductive material. For example, the anode electrode 510 can include one or more of silver (Ag), aluminum (Al), gold (Au), molybdenum (Mo), tungsten (W), chromium (Cr), or one or more alloys including one or more of silver (Ag), aluminum (Al), gold (Au), molybdenum (Mo), tungsten (W), and chromium (Cr). For example, the anode electrode 510 can be formed of a stack of three layers: silver (Ag), lead (Pb), and copper (Cu). However, examples of the anode electrode 510 are not limited thereto.

In an example where the light emitting display device 100 has a bottom emission structure, the anode electrode 510 can include a transparent conductive material capable of transmitting light. For example, the anode electrode 510 can include at least one of indium tin oxide (ITO) and indium zinc oxide (IZO). However, examples of the anode electrode 510 are not limited thereto.

A bank layer 520 can be disposed on the anode electrode 510 and the planarization layer 170. The bank layer 520 can define a plurality of subpixels SP such that the bank layer 520 separates each subpixel SP from one another, and minimize a light blurring phenomenon and prevent color mixing occurring at various viewing angles.

The bank layer 520 can have a bank hole exposing the anode electrode 510 corresponding to a light emitting area.

The bank layer 520 can include, for example, one or more of inorganic insulating materials such as silicon nitride (SiNx) or silicon oxide (SiOx), or organic insulating materials such as benzocyclobutene (BCB), acrylic resin, epoxy resin, phenolic resin, polyamide resin, or polyimide resin. However, examples of the bank layer 520 are not limited thereto.

A spacer can be further disposed on the bank layer 520. The spacer can serve to reduce deformation or compression for an empty space between the substrate 110 on which the light emitting element layer 500 is disposed and an upper substrate, thereby minimizing damage to the light emitting display device 100 from impact from the outside. The spacer can include the same material as the bank layer 520, and be formed simultaneously or together with the bank layer 520. However, embodiments of the spacer are not limited thereto.

The emission layer 530 can be disposed on the anode electrode 510 and the bank layer 520. The emission layer 530 can include one of a red organic emission layer, a green organic emission layer, a blue organic emission layer, and a white organic emission layer in order to emit light of a specific color. In an example where the emission layer 530 includes a white organic emission layer, one or more color filters for converting white light from the white organic emission layer into light of one or more different colors can be disposed on the light emitting element layer 500. The emission layer 530 can further include a hole injection layer, a hole transport layer, an electron transport layer, an electron injection layer, and the like in addition to the organic emission layer. However, embodiments of the emission layer 530 are not limited thereto.

A cathode electrode 540 can be disposed on the emission layer 530. The cathode electrode 540 can supply electrons to the emission layer 530 and can include a conductive material having a low work function.

In an example where the light emitting display device 100 has the top emission structure, the cathode electrode 540 can include a transparent conductive material capable of transmitting light. For example, the cathode electrode 540 can include at least one of indium tin oxide (ITO) and indium zinc oxide (IZO). However, examples of the cathode electrode 540 are not limited thereto.

In another example, the cathode electrode 540 can include a translucent conductive material capable of transmitting light. For example, the cathode electrode 540 can include one or more of alloys such as LiF and Al, CsF and Al, Mg:Ag, Ca and Ag, Ca:Ag, LiF and Mg:Ag, LiF and Ca and Ag, and LiF and Ca:Ag. However, examples of the cathode electrode 540 are not limited thereto.

In an example where the light emitting display device 100 has the bottom emission structure, the cathode electrode 540 can be a reflective electrode reflecting light and include an opaque conductive material. For example, the cathode electrode 540 can include one or more of silver (Ag), aluminum (Al), gold (Au), molybdenum (Mo), tungsten (W), chromium (Cr), or one or more alloys including one or more of silver (Ag), aluminum (Al), gold (Au), molybdenum (Mo), tungsten (W), and chromium (Cr).

A protective layer 600 can be disposed on the cathode electrode 540 of the light emitting element layer 500. The protective layer 600 can protect the light emitting element layer 500 from moisture, oxygen, or other undesirable substances from the outside. For example, the protective layer 600 can prevent the penetration of oxygen and moisture from the outside to prevent the oxidation of a light emitting material and an electrode material.

The protective layer 600 can include a transparent material so that light emitted from the emission layer 530 can transmit the protective layer 600.

The protective layer 600 can include a first protective layer 610, a second protective layer 620, and a third protective layer 630 to prevent the penetration of moisture or oxygen. The first protective layer 610, the second protective layer 620, and the third protective layer 630 can be alternately stacked. The protective layer 600 can include a transparent material so that light emitted from the emission layer 530 can transmit the protective layer 600.

The first protective layer 610 and the third protective layer 630 can include, for example, one or more inorganic materials of silicon nitride (SiNx), silicon oxide (SiOx), or aluminum oxide (AlyOz). However, examples of the first protective layer 610 and the third protective layer 630 are not limited thereto. The first protective layer 610 and the third protective layer 630 can be formed, for example, using a vacuum deposition technique such as a chemical vapor deposition (CVD), an atomic layer deposition (ALD), or the like. However, examples of the first protective layer 610 and the third protective layer 630 are not limited thereto.

The second protective layer 620 can cover undesirable substances or particles that can be generated in the manufacturing process. Further, the second protective layer 620 can serve to planarize the surface of the first protective layer 610. For example, the second protective layer 620 can be a particle cover layer, but the term thereof is not limited thereto.

The second protective layer 620 can include an organic material, for example, a polymer based on silicon oxycarbon (SiOCz) epoxy, polyimide, polyethylene, or acrylate. However, examples of the second protective layer 620 are not limited thereto.

The second protective layer 620 can include a heat-curable material cured by heat, or a light-curable material cured by light.

Hereinafter, an example configuration of the light emitting display device according to aspects of the present disclosure in which a touch sensor layer is included will be described.

Figure 5:
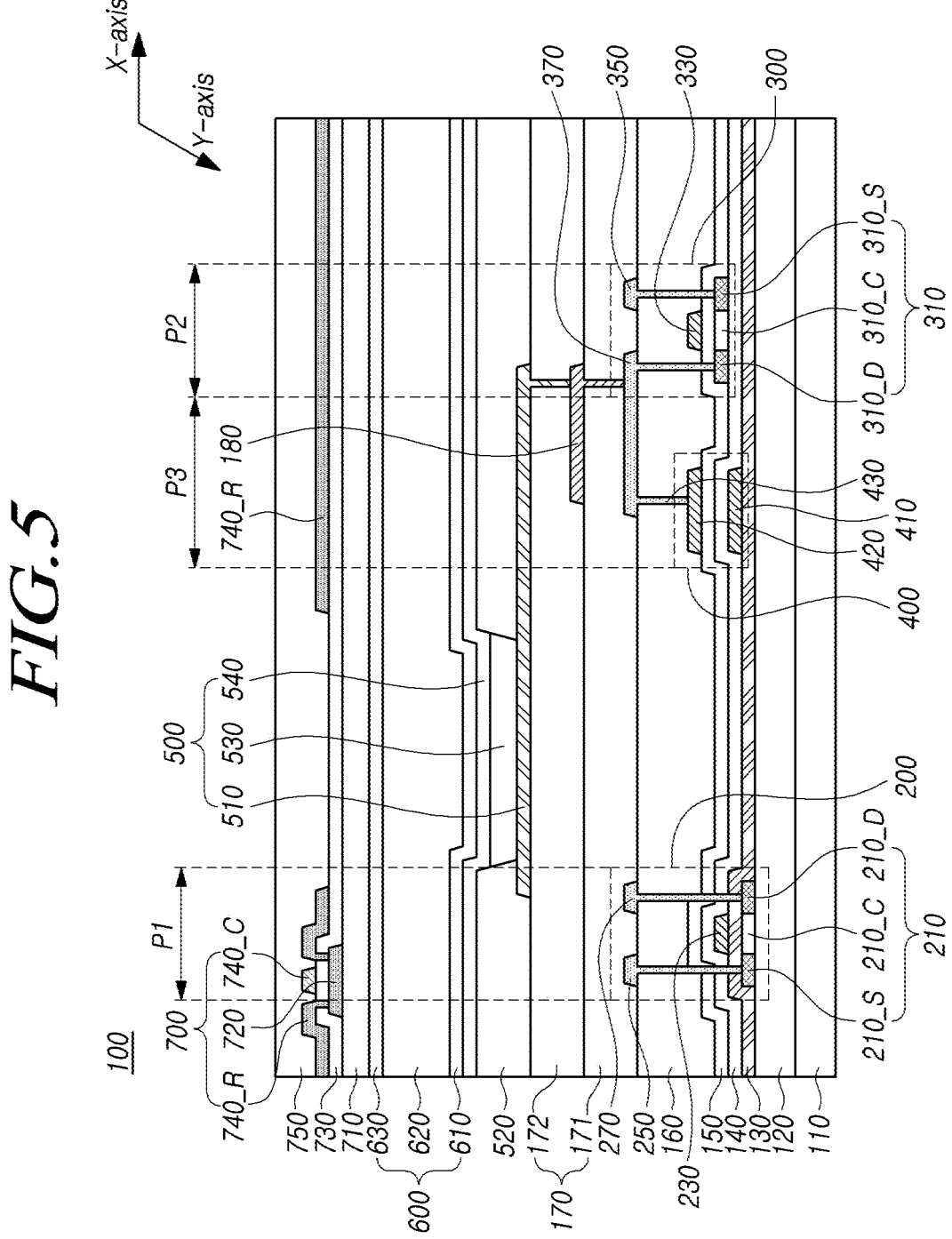
FIG. 5 is an example cross-sectional view of the light emitting display device in which a touch sensor layer is included according to aspects of the present disclosure.

FIG. 5 is an example cross-sectional view of the light emitting display device 100 including a touch sensor layer according to aspects of the present disclosure.

As the configuration of the light emitting display device 100 of FIG. 5 except for the touch sensor layer is the same as, or is substantially the same as, that of the light emitting display device 100 of FIG. 4, repeated discussions on the same configuration will be omitted for simplicity of description, or may be briefly provided.

Referring to FIG. 5, the touch sensor layer 700 can include a first touch electrode 740_R, a first touch connection electrode 720, a second touch electrode, and a second touch connection electrode 740_C.

A touch buffer layer 710 can be disposed on the protective layer 600. The touch buffer layer 710 can prevent the penetration of one or more chemicals (a developer, an etchant, and the like) used in the process of manufacturing the touch sensor layer 700 and/or moisture or other undesirable substances from the outside into the light emitting element layer 500 including an organic material. Further, the touch buffer layer 710 can prevent a plurality of touch sensor metals disposed on the touch buffer layer 710 from being disconnected due to an external impact, and shield interference signals that can occur while the touch sensor layer is driven.

For example, the touch buffer layer 710 can be formed of a single layer including one, or a multilayer including two or more, of silicon oxide (SiOx), silicon nitride (SiNx), or one or more alloys including one or more of silicon oxide (SiOx) or silicon nitride (SiNx). However, examples of the touch buffer layer 710 are not limited thereto. In another example, the touch buffer layer 710 can include an organic material such as an acrylic resin, an epoxy resin, a phenolic resin, a polyamide resin, a polyimide resin, or the like.

The first touch connection electrode 720 can be disposed on the touch buffer layer 710.

For example, the first touch connection electrode 720 can be disposed between adjacent first touch electrodes 740_R in a first direction (or an X-axis direction). The first touch connection electrode 720 can electrically connect between a plurality of first touch electrodes 740_R spaced apart from, and adjacent to, one another in the first direction (or the X-axis direction). However, embodiments of the first touch connection electrode 720 are not limited thereto.

The first touch connection electrode 720 can be disposed to overlap the second touch connection electrode 740_C connecting between two or more second touch electrodes adjacent to one another in a second direction (or a Y-axis direction). The first touch connection electrode 720 and the second touch connection electrode 740_C can be disposed in different layers, and thus be electrically insulated from each other.

A touch insulating layer 730 can be disposed on the touch buffer layer 710 and the first touch connection electrode 720.

The touch insulating layer 730 can include a hole to electrically connect between the first touch electrode 740_R and the first touch connection electrode 720.

The touch insulating layer 730 can electrically insulate the second touch connection electrode 740_C from the first touch connection electrode 720.

The touch insulating layer 730 can be formed of, for example, a single layer including silicon nitride (SiNx) or silicon oxide (SiOx) or a multilayer including silicon nitride (SiNx) and/or silicon oxide (SiOx). However, examples of the touch insulating layer 730 are not limited thereto.

The first touch electrode 740_R, a second touch electrode, and the second touch connection electrode 740_C can be disposed on the touch insulating layer 730.

The first touch electrode 740_R and the second touch electrode can be spaced apart by a predefined distance from each other. First touch electrodes 740_R adjacent to each other among first touch electrodes 740_R disposed in the first direction (or the X-axis direction) can be spaced apart from each other. A plurality of first touch electrodes 740_R adjacent to each other among first touch electrodes 740_R disposed in the first direction (or the X-axis direction) can be connected to the first touch connection electrode 720 disposed between the adjacent first touch electrodes 740_R. For example, the adjacent first touch electrodes 740_R can be connected to the first touch connection electrode 720 through holes formed in the touch insulating layer 730.

Second touch electrodes adjacent to each other among second touch electrodes disposed in the second direction (or the Y-axis direction) can be connected by the second touch connection electrode 740_C. The second touch electrode and the second touch connection electrode 740_C can be disposed in the same layer. For example, the second touch connection electrode 740_C can be disposed between second touch electrodes in the same layer as the second touch electrodes. The second touch electrode can extend from an edge thereof, and the extended portion of the second touch electrode can form the second touch connection electrode 740_C.

The first touch electrode 740_R, the second touch electrode, and the second touch connection electrode 740_C can be formed through a same process.

A touch planarization layer 750 can be disposed on the first touch electrode 740_R, the second touch electrode, and the second touch connection electrode 740_C.

The touch planarization layer 750 can cover the touch insulating layer 730, the first touch electrode 740_R, the second touch electrode, and the second touch connection electrode 740_C.

The touch planarization layer 750 can include, for example, one or more of organic insulating materials such as benzocyclobutene (BCB), acrylic resin, epoxy resin, phenolic resin, polyamide resin, or polyimide resin. However, examples of the touch planarization layer 750 are not limited thereto.

A touch driving circuit can receive a touch sensing signal from the first touch electrode 740_R. The touch driving circuit can transmit a touch driving signal to the second touch electrode. The touch driving circuit can detect a touch performed by a user based on one or more mutual capacitances formed between one or more first touch electrodes 740_R and one or more second touch electrodes. For example, when a touch operation is applied to the light emitting display device 100, the touch operation can cause a change in capacitance between the first touch electrode 740_R and the second touch electrode. The touch driving circuit can detect touch coordinates by detecting the capacitance change.

Hereinafter, further another example configuration of the light emitting display device according to aspects of the present disclosure will be described with reference to FIG. 6.

Figure 6:
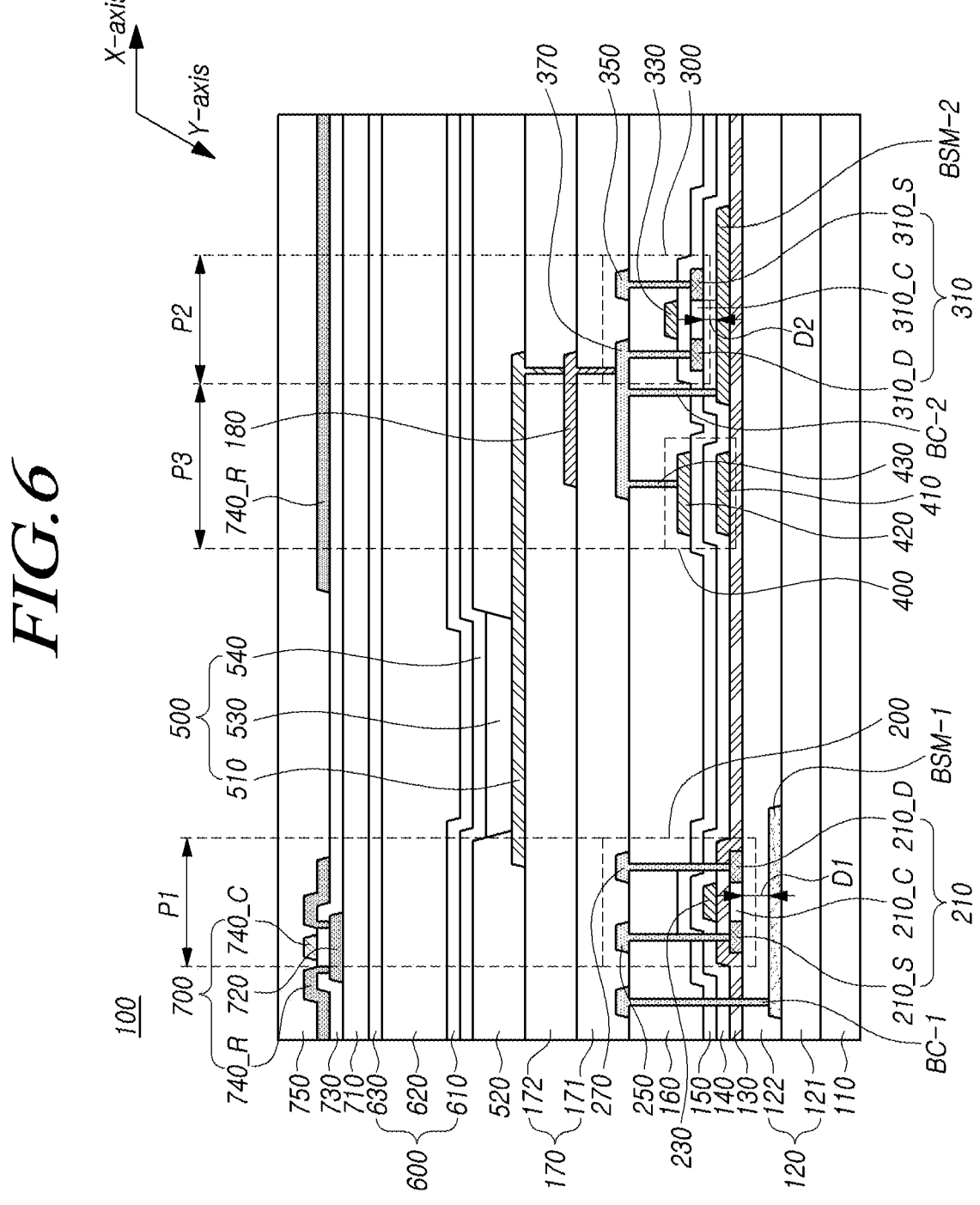
FIG. 6 is an example cross-sectional view of the light emitting display device according to aspects of the present disclosure.

FIG. 6 is another example cross-sectional view of the light emitting display device according to aspects of the present disclosure.

Referring to FIG. 6, the light emitting display device 100 according to aspects of the present disclosure can further include a first shielding layer BSM-1 and a second shielding layer BSM-2.

As the configuration of the light emitting display device 100 of FIG. 6 except for a buffer layer 120, a first shielding layer BSM-1, and a second shielding layer BSM-2 is substantially the same as that of the light emitting display device 100 of FIG. 4, repeated discussions on the substantial same configuration will be omitted for simplicity of description, or may be briefly provided.

The first shielding layer BSM-1 and the second shielding layer BSM-2 can be disposed under the first thin film transistor 200 and the second thin film transistor 300. For example, the first shielding layer BSM-1 can be disposed under the first semiconductor pattern 210 located in the first area P1 such that the first shielding layer BSM-1 overlaps the first semiconductor pattern 210. Further, the second shielding layer BSM-2 can be disposed under the second semiconductor pattern 310 located in the second area P2 such that the second shielding layer BSM-2 overlaps the second semiconductor pattern 310.

The first shielding layer BSM-1 and the second shielding layer BSM-2 can have an area greater than the first semiconductor pattern 210 and the second semiconductor pattern 310.

The shielding layers can prevent the malfunction of the semiconductor patterns caused by the irradiation of light incident from the outside of the light emitting display device to the semiconductor patterns.

The shielding layers can prevent the inflow of charges from the substrate. For example, when a voltage is applied to the gate electrode of a thin film transistor for a long time, charges of the substrate can flow into a channel region of a semiconductor pattern of the thin film transistor due to electric field E formed across the thin film transistor, and thus, such charges can change an amount of charges in the channel region. Charges according to such a back channel phenomenon can be holes or electrons depending on the polarity of the electric field. The substrate can cause a change in the threshold voltage of the thin film transistor by changing a current flowing the thin film transistor. This can cause a change in the luminance of a corresponding pixel and an afterimage. To address these issues, by disposing the shielding layers between the substrate and the semiconductor patterns, undesirable charges flowing from the substrate to the thin film transistor can be shielded, and afterimages can be prevented by preventing a change in the threshold voltage (Vth) of the thin film transistor. The stability of the thin film transistor when being driven can be enhanced, and as a result, display quality can be improved.

The first shielding layer BSM-1 and the second shielding layer BSM-2 can include an opaque conductive material to shield light incident from the outside of the light emitting display device 100. For example, the first shielding layer BSM-1 and the second shielding layer BSM-2 can be formed of a single layer including one, or a multilayer including two or more, of molybdenum (Mo), copper (Cu), titanium (Ti), aluminum (Al), chromium (Cr), gold (Au), nickel (Ni), neodymium (Nd), or tungsten (W), or one or more alloys including one or more of molybdenum (Mo), copper (Cu), titanium (Ti), aluminum (Al), chromium (Cr), gold (Au), nickel (Ni), neodymium (Nd), or tungsten (W). However, examples of the first shielding layer BSM-1 and the second shielding layer BSM-2 are not limited thereto.

The first shielding layer BSM-1 and the second shielding layer BSM-2 can include titanium (Ti) that is stably bonded to hydrogen. Hydrogen remaining between the substrate and one or more insulating layers by a semiconductor pattern forming process can be shielded from penetrating into the semiconductor patterns by the first shielding layer BSM-1 and the second shielding layer BSM-2. Therefore, the semiconductor patterns can be prevented from becoming conductive by the first shielding layer BSM-1 and the second shielding layer BSM-2, and as a result, reliability of the operating characteristics of thin film transistors of the light emitting display device 100 according to aspects of present disclosure can be improved.

A buffer layer 120 can include a first buffer layer 121 and a second buffer layer 122. The first buffer layer 121 and the second buffer layer 122 can be sequentially disposed.

The first shielding layer BSM-1 can be disposed on the first buffer layer 121 in the first area P1.

The first shielding layer BSM-1 can be electrically connected to a first shielding layer connection electrode BC-1.

A voltage with a predefined value from the outside can be supplied to the first shielding layer connection electrode BC-1. Therefore, the first shielding layer BSM-1 can remain at the same voltage as the first shielding layer connection electrode BC-1, this reducing a change in characteristics of elements disposed around the first shielding layer BSM-1. For example, since the first shielding layer BSM-1 is less affected by an external voltage, a change in the threshold voltage Vth of the first thin film transistor 200 due to the back channel phenomenon can be prevented.

The second shielding layer BSM-2 can be disposed on the first insulating layer 130 in the second area P2.

The second shielding layer BSM-2 can be disposed in the same layer as the first gate electrode 230 and the first storage capacitor electrode 410, while being disposed on the first insulating layer 130. Thus, the number of processes and manufacturing cost can be reduced.

The second shielding layer BSM-2 can include the same material as the first gate electrode 230 and the first storage capacitor electrode 410.

The second shielding layer BSM-2 can be electrically connected to the second drain electrode 370 through a second shielding layer connection electrode BC-2.

The second shielding layer connection electrode BC-2 can be disposed in holes of the first interlayer insulating layer 140, the second insulating layer 150, and the second interlayer insulating layer 160, and can electrically connect between the second drain electrode 370 and the second shielding layer BSM-2.

For example, when the light emitting display device 100 is driven, the second shielding layer BSM-2 can remain at the same voltage as the second drain electrode 370, this reducing a change in characteristics of elements disposed around the second shielding layer BSM-2. For example, since the second shielding layer BSM-2 is less affected by an external voltage, a change in the threshold voltage Vth of the second thin film transistor 300 due to the back channel phenomenon can be prevented.

The second shielding layer connection electrode BC-2 can include the same material as the first source electrode 250, the first drain electrode 270, the second source electrode 350, the second drain electrode 370, the second connection electrode 430, and the first shielding layer connection electrode BC-1. The second shielding layer connection electrode BC-2 can be formed of a single layer including one, or a multilayer including two or more, of molybdenum (Mo), copper (Cu), titanium (Ti), aluminum (Al), chromium (Cr), gold (Au), nickel (Ni), or neodymium (Nd), or one or more alloys including one or more of molybdenum (Mo), copper (Cu), titanium (Ti), aluminum (Al), chromium (Cr), gold (Au), nickel (Ni), or neodymium (Nd). However, embodiments of the second shielding layer connection electrode BC-2 are not limited thereto.

The first shielding layer BSM-1 in the first area P1 and the second shielding layer BSM-2 in the second area P2 can be disposed in different layers. The first shielding layer BSM-1 can be disposed in a lower location than the second shielding layer BSM-2.

At least two insulating layers or buffer layers can be interposed between the first shielding layer BSM-1 and the second shielding layer BSM-2. For example, the second buffer layer 122 and the first insulating layer 130 can be disposed between the first shielding layer BSM-1 and the second shielding layer BSM-2.

The first semiconductor pattern 210 of the first thin film transistor 200 and the first shielding layer BSM-1 can have a first vertical distance D1. The second semiconductor pattern 310 of the second thin film transistor 300 and the second shielding layer BSM-2 can have a second vertical distance D2. The second vertical distance D2 can be less than the first vertical distance D1.

Hereinafter, low grayscale formation of a thin film transistor according to a vertical distance in the light emitting display device 100 according to aspects of the present disclosure will be described with reference to FIGS. 7A and 7B.

Figure 7A:
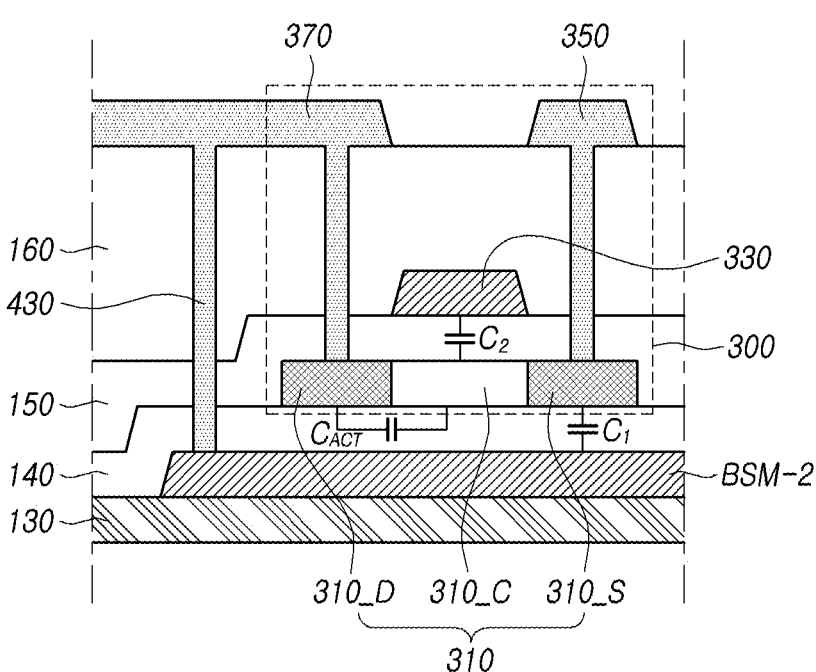
FIG. 7A is an example cross-sectional view of a second thin film transistor in the light emitting display device of FIG. 6 according to aspects of the present disclosure.

FIG. 7A is an example cross-sectional view of the second thin film transistor in the light emitting display device of FIG. 6 according to aspects of the present disclosure.

Figure 7B:
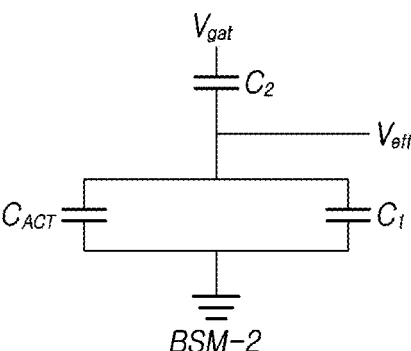
FIG. 7B illustrates an example of parasitic capacitors formed in the second thin film transistor of FIG. 7A.

FIG. 7B illustrates an example of parasitic capacitors formed in the second thin film transistor of FIG. 7A.

Referring to FIGS. 7A and 7B, in an example where a driving thin film transistor includes an oxide semiconductor, since a current fluctuation value relative to a unit voltage fluctuation value is large due to the material characteristics of the oxide semiconductor, there often occur display artifacts at low grayscales where accurate current control is required. In one or more embodiments, the light emitting display device 100 according to aspects of the present disclosure can employ a driving thin film transistor in which a variance value of a current in a semiconductor pattern is relatively insensitive with respect to a variance value of a voltage applied to a gate electrode.

A specific voltage can be applied to the second shielding layer BSM-2. The voltage applied to the second shielding layer BSM-2 can be different from a voltage applied to the second gate electrode 330. For example, the second shielding layer BSM-2 can be electrically connected to the second drain electrode 370. Such a predefined voltage can be applied to the second shielding layer BSM-2 regardless of a voltage applied to the second gate electrode 330. As a result, a parasitic capacitance having a first capacitance C1 can be formed between the second shielding layer BSM-2 and the second semiconductor pattern 310. A parasitic capacitance having a second capacitance C2 can be formed between the second semiconductor pattern 310 and the second gate electrode 330.

As a second source region 310_S and a second drain region 310_D corresponding to side portions of the second semiconductor pattern 310 are doped with impurities, a parasitic capacitance having a third capacitance $C_{ACT}$ can be formed inside the second semiconductor pattern 310 when a voltage is applied to the semiconductor pattern.

In the light emitting display device 100 according to aspects of the present disclosure, an amount of variance of an effective gate voltage that affects a driving current applied to the light emitting element layer 500 can be determined by the following equation.

[Equation 1]

$$\Delta V_{\textit{eff}} = \frac{C2}{C2 + C_{ACT} + C1} \times \Delta V_{GAT}$$

Here, ΔVeff represents the amount of variance (or an effective voltage) of an effective gate voltage, and can be a voltage actually applied to a channel of the second semiconductor pattern 310. Further, $\Delta_{VGAT}$ represents the amount of variance of a voltage applied to the second gate electrode 330.

Referring to Equation 1, it can be understood that adjusting a first parasitic capacitance C1 formed between the second shielding layer BSM-2 and the second semiconductor pattern 310 can affect the generation of a driving current. For example, since the effective voltage ΔVeff applied to the channel of the second semiconductor pattern 310 is in inverse proportion to the first capacitance C1, an effective voltage applied to the oxide semiconductor pattern can be adjusted by controlling the first capacitance C1.

$$C=Q/V=\varepsilon_0 A/d \qquad \text{[Equation 2]}$$

(ε0: permittivity, A: area, d: electrode distance)

Referring to [Equation 2], capacitance increases as a distance between electrodes decreases. In this manner, when the second shielding layer BSM-2 is disposed closer to the second semiconductor pattern 310, the magnitude of the parasitic capacitance C1 is increased, and therefore, the amount of variance ΔVeff of a voltage value applied to the second semiconductor pattern 310 can be reduced.

The reduction in the amount of variance $\Delta$ of the effective current value flowing through the second semiconductor pattern 310 can mean that a control range of the second thin film transistor 300 that can be controlled through the amount of variance $\Delta V_{GAT}$ of the voltage applied to the second gate electrode 330 is increased.

Accordingly, a second vertical distance D2 between the second semiconductor pattern 310 of the second thin film transistor 300 and the second shielding layer BSM-2 becomes less than a first vertical distance D1 between the first semiconductor pattern 210 of the first thin film transistor 200 and the first shielding layer BSM-1, and thereby, a range of grayscales controlled by the second thin film transistor 300 can be increased. As a result, since the light emitting element layer can be accurately controlled even in low grayscales, display artifacts such as screen stains frequently occurring in low grayscales can be reduced or eliminated.

The display device according to the embodiments herein of the present disclosure can be described as follows.

According to one aspect of present disclosure, a light emitting display device (e.g., the light emitting display device 100) can include a first thin film transistor including a first semiconductor pattern, a first gate electrode, and first source and drain electrodes; a second thin film transistor including a second semiconductor pattern, a second gate electrode, and second source and drain electrodes; a storage capacitor including a first storage capacitor electrode and a second storage capacitor electrode; and a light emitting element layer electrically connected to the second thin film transistor, wherein the first storage capacitor electrode can be disposed in the same layer as the first gate electrode, and the second storage capacitor electrode can be disposed in the same layer as the second gate electrode.

According to one or more embodiments of the present disclosure, the first storage capacitor electrode can include the same material as the first gate electrode, and the second storage capacitor electrode can include the same material as the second gate electrode.

According to one or more embodiments of the present disclosure, at least two insulating layers can be interposed between the first storage capacitor electrode and the second storage capacitor electrode.

According to one or more embodiments of the present disclosure, the second storage capacitor electrode can be electrically connected to the second semiconductor pattern through the second drain electrode.

According to one or more embodiments of the present disclosure, the second storage capacitor electrode can be electrically connected to the light emitting element layer through the second drain electrode.

According to one or more embodiments of the present disclosure, the light emitting display device can further comprise a first shielding layer disposed in a lower location than the first semiconductor pattern, and a second shielding layer disposed in a lower location than the second semiconductor pattern.

According to one or more embodiments of the present disclosure, the second shielding layer can be disposed in the same layer as the first gate electrode and the first storage capacitor electrode.

According to one or more embodiments of the present disclosure, the first shielding layer can at least partially overlap the first semiconductor pattern, and the second shielding layer can at least partially overlap the second semiconductor pattern.

According to one or more embodiments of the present disclosure, at least two insulating layers or buffer layers can be interposed between the first shielding layer and the second shielding layer.

According to one or more embodiments of the present disclosure, the second shielding layer can be electrically connected to the second drain electrode through a second shielding layer connection electrode.

According to one or more embodiments of the present disclosure, the second shielding layer can be electrically connected to the second semiconductor pattern through the second shielding layer connection electrode and the second drain electrode.

According to one or more embodiments of the present disclosure, the second shielding layer can be electrically connected to a storage capacitor through the second shielding layer connection electrode and the second drain electrode.

According to one or more embodiments of the present disclosure, the first source electrode, the first drain electrode, the second source electrode, and the second drain electrode can be disposed in the same layer.

According to one or more embodiments of the present disclosure, the first semiconductor pattern can include a polycrystalline semiconductor pattern, and the second semiconductor pattern can include an oxide semiconductor pattern.

According to one or more embodiments of the present disclosure, the first semiconductor pattern and the second semiconductor pattern can include an oxide semiconductor pattern.

According to one or more embodiments of the present disclosure, the light emitting display device can further include a touch sensor layer.

According to one or more embodiments of the present disclosure, the touch sensor layer can include a first touch connection electrode, a touch insulating layer disposed on the first touch connection electrode, and a first touch electrode and a second touch electrode disposed on the touch insulating layer.

According to another aspect of present disclosure, a light emitting display device (e.g., the light emitting display device 100) can include a first thin film transistor including a first semiconductor pattern, a first gate electrode, and first source and drain electrodes; a second thin film transistor including a second semiconductor pattern, a second gate electrode, and second source and drain electrodes; and a storage capacitor including a first storage capacitor electrode and a second storage capacitor electrode, wherein a layer in which the second semiconductor pattern is disposed can be located between a layer in which the first storage capacitor electrode is disposed and a layer in which the second storage capacitor electrode is disposed.

According to one or more embodiments of the present disclosure, a layer in which the first semiconductor pattern is disposed can be a layer other than a layer between the layer in which the first storage capacitor electrode is disposed and the layer in which the second storage capacitor electrode is disposed.

According to one or more embodiments of the present disclosure, a layer in which the first gate electrode is disposed is the same as the layer in which the first storage capacitor electrode is disposed, and a layer in which the second gate electrode is disposed is the same as the layer in which the second storage capacitor electrode is disposed.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The above description and the accompanying drawings provide an example of the technical idea of the present invention for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A light emitting display device comprising:
a first thin film transistor comprising a first semiconductor pattern, a first gate electrode, and first source and drain electrodes;
a second thin film transistor comprising a second semiconductor pattern, a second gate electrode, and second source and drain electrodes;
a storage capacitor comprising a first storage capacitor electrode and a second storage capacitor electrode; and
a light emitting element layer electrically connected to the second thin film transistor,
wherein the first storage capacitor electrode is disposed in a same layer as the first gate electrode, and the second storage capacitor electrode is disposed in a same layer as the second gate electrode, and
wherein the first semiconductor pattern and the second semiconductor pattern are disposed in different layers.

2. The light emitting display device of claim 1, wherein the first storage capacitor electrode comprises a same material as the first gate electrode, and the second storage capacitor electrode comprises a same material as the second gate electrode.

3. The light emitting display device of claim 1, wherein at least two insulating layers are interposed between the first storage capacitor electrode and the second storage capacitor electrode.

4. The light emitting display device of claim 1, wherein the second storage capacitor electrode is electrically connected to the second semiconductor pattern through the second drain electrode.

5. The light emitting display device of claim 1, wherein the second storage capacitor electrode is electrically connected to the light emitting element layer through the second drain electrode.

6. The light emitting display device of claim 1, further comprising:
a first shielding layer disposed at a lower location than the first semiconductor pattern; and
a second shielding layer disposed at a lower location than the second semiconductor pattern.

7. The light emitting display device of claim 6, wherein the second shielding layer is disposed in a same layer as the first gate electrode and the first storage capacitor electrode.

8. The light emitting display device of claim 6, wherein the first shielding layer at least partially overlaps the first semiconductor pattern, and the second shielding layer at least partially overlaps the second semiconductor pattern.

9. The light emitting display device of claim 6, wherein at least two insulating layers or buffer layers are interposed between the first shielding layer and the second shielding layer.

10. The light emitting display device of claim 6, wherein the second shielding layer is electrically connected to the second drain electrode through a second shielding layer connection electrode.

11. The light emitting display device of claim 10, wherein the second shielding layer is electrically connected to the second semiconductor pattern through the second shielding layer connection electrode and the second drain electrode.

12. The light emitting display device of claim 10, wherein the second shielding layer is electrically connected to the storage capacitor through the second shielding layer connection electrode and the second drain electrode.

13. The light emitting display device of claim 1, wherein the first source electrode, the first drain electrode, the second source electrode, and the second drain electrode are disposed in a same layer.

14. The light emitting display device of claim 1, wherein the first semiconductor pattern comprises a polycrystalline semiconductor pattern, and the second semiconductor pattern comprises an oxide semiconductor pattern.

15. The light emitting display device of claim 1, wherein the first semiconductor pattern and the second semiconductor pattern comprise an oxide semiconductor pattern.

16. The light emitting display device of claim 1, further comprising a touch sensor layer.

17. The light emitting display device of claim 16, wherein the touch sensor layer comprises:
a first touch connection electrode,
a touch insulating layer disposed on the first touch connection electrode, and
a first touch electrode and a second touch electrode disposed on the touch insulation layer.

18. A light emitting display device comprising:
a first thin film transistor comprising a first semiconductor pattern, a first gate electrode, and first source and drain electrodes:
a second thin film transistor comprising a second semiconductor pattern, a second gate electrode, and second source and drain electrodes; and
a storage capacitor comprising a first storage capacitor electrode and a second storage capacitor electrode,
wherein a layer in which the second semiconductor pattern is disposed is located between a layer in which the first storage capacitor electrode is disposed and a layer in which the second storage capacitor electrode is disposed, and
wherein the first semiconductor pattern and the second semiconductor pattern are disposed in different layers.

19. The light emitting display device of claim 18, wherein a layer in which the first semiconductor pattern is disposed is a layer other than a layer between the layer in which the first storage capacitor electrode is disposed and the layer in which the second storage capacitor electrode is disposed.

20. The light emitting display device of claim 18, wherein a layer in which the first gate electrode is disposed is the same as the layer in which the first storage capacitor electrode is disposed, and a layer in which the second gate electrode is disposed is the same as the layer in which the second storage capacitor electrode is disposed.

21. A light emitting display device comprising:

a switching thin film transistor comprising a polycrystalline semiconductor pattern, a first gate electrode, and first source and drain electrodes;

a driving thin film transistor comprising an oxide semiconductor pattern, a second gate electrode, and second source and drain electrodes;

a storage capacitor comprising a first storage capacitor electrode and a second storage capacitor electrode;

a first shielding layer disposed under the polycrystalline semiconductor pattern and at least partially overlapping the polycrystalline semiconductor pattern; and a second shielding layer disposed under the oxide semiconductor pattern and at least partially overlapping the oxide semiconductor pattern, wherein a first vertical distance between first shielding layer and the polycrystalline semiconductor pattern is larger than a second vertical distance between the second shielding layer and the oxide semiconductor pattern.

22. The light emitting display device of claim 21, wherein the first storage capacitor electrode is disposed in a same layer as the first gate electrode, and the second storage capacitor electrode is disposed in a same layer as the second gate electrode.

* * * * *